United States Patent
Duan et al.

(10) Patent No.: US 7,325,591 B2
(45) Date of Patent: Feb. 5, 2008

(54) LIQUID-COOLING HEAT DISSIPATION APPARATUS

(75) Inventors: Qiang-Fei Duan, Chung-Ho (TW); Lieh-Feng Lo, Chung-Ho (TW)

(73) Assignee: Cooler Master Co., Ltd., Taipei (TW)

( * ) Notice: Subject to any disclaimer, the term of this patent is extended or adjusted under 35 U.S.C. 154(b) by 429 days.

(21) Appl. No.: 11/060,419

(22) Filed: Feb. 18, 2005

(65) Prior Publication Data

US 2006/0185829 A1    Aug. 24, 2006

(51) Int. Cl.
*H05K 7/20* (2006.01)
(52) U.S. Cl. ............... 165/104.33; 165/80.4; 165/120; 361/699
(58) Field of Classification Search .......... 165/80.4, 165/104.33; 361/699
See application file for complete search history.

(56) References Cited

U.S. PATENT DOCUMENTS

| | | | |
|---|---|---|---|
| 6,019,165 A * | 2/2000 | Batchelder | 165/80.3 |
| 6,166,907 A * | 12/2000 | Chien | 361/699 |
| 6,263,957 B1 * | 7/2001 | Chen et al. | 165/80.4 |
| 6,408,937 B1 * | 6/2002 | Roy | 165/104.33 |
| 6,668,911 B2 * | 12/2003 | Bingler | 165/80.4 |
| 6,894,899 B2 * | 5/2005 | Wu et al. | 361/699 |
| 7,100,677 B2 * | 9/2006 | Lee et al. | 165/80.4 |
| 7,124,811 B2 * | 10/2006 | Crocker et al. | 165/104.33 |
| 7,156,160 B2 * | 1/2007 | Lee et al. | 165/104.33 |
| 7,222,661 B2 * | 5/2007 | Wei et al. | 165/80.4 |
| 2004/0052049 A1 * | 3/2004 | Wu et al. | 361/699 |
| 2004/0188065 A1 * | 9/2004 | Shook et al. | 165/80.4 |
| 2004/0240179 A1 * | 12/2004 | Koga et al. | 361/699 |
| 2007/0029069 A1 * | 2/2007 | Duan | 165/80.4 |

* cited by examiner

*Primary Examiner*—Allen J. Flanigan (57) ABSTRACT

A liquid-cooling heat dissipation apparatus includes a casing, a first compartment defined in the casing for assembling a liquid driving unit, a cooling plate module on bottom of the casing, a second compartment defined between an inner space of the casing and the cooling plate module and containing a cooling liquid therein. At least one liquid inlet and liquid outlet are defined on the casing and communicated through the second compartment. Therefore, the liquid driving unit and the cooling plate module can be advantageously integrated into the casing while the duct is reduced to achieve compact space. Moreover, the overall structure achieves liquid storing, circulating and heat conveying function.

10 Claims, 8 Drawing Sheets

LIQUID-COOLING HEAT DISSIPATION APPARATUS

BACKGROUND OF THE INVENTION

1. Field of the Invention

The present invention relates to a liquid-cooling heat dissipation apparatus, and more particularly to a liquid-cooling heat dissipation apparatus used for heat emitting device such as a CPU.

2. Description of Prior Art

The computers are developed with more powerful function and computation speed. Beside performance issue, the product appearance, the construction and motherboard connection ways are also under extensive exploited. As downsize of form factor and increasing of processing speed, the heat dissipation for central processing unit (CPU) is also an important issue to solve.

Figure 1:
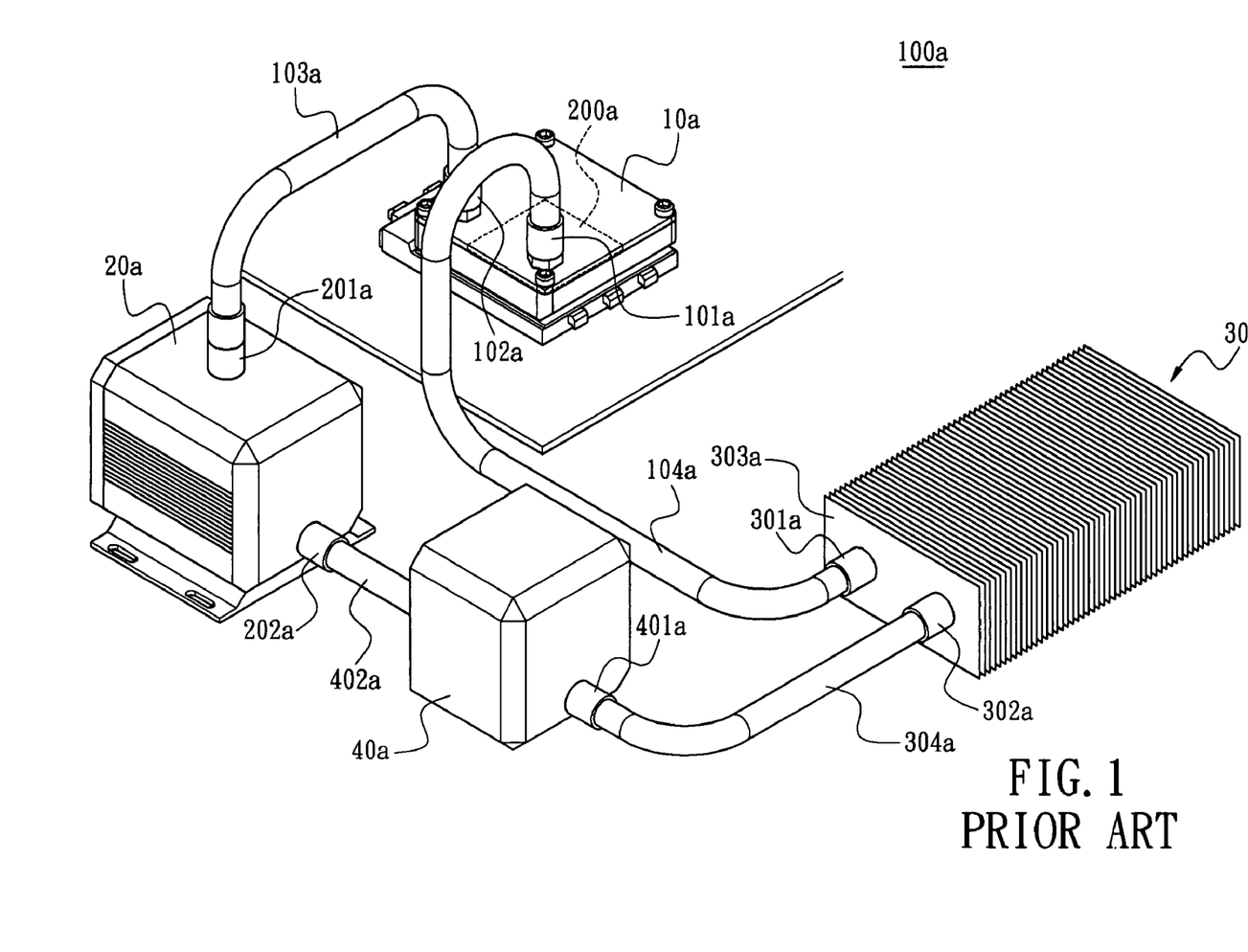
FIG. 1 shows a perspective view of a prior art liquid-cooling heat dissipation system.

FIG. 1 shows a perspective view of a prior art liquid-cooling heat dissipation system 100a. As shown in this figure, the liquid-cooling heat dissipation system 100a comprises a heat dissipation stage 10a, a water outlet 101a and a water inlet 102a on both ends of the heat dissipation system stage 10a, respectively, a duct 103a connected between the water inlet 102a and a water outlet 201a of a water pump 20a, a duct 104a connected between the water outlet 101a and a water inlet 301a of a cooling stage 30a, which is composed of a plurality of heat-dissipating fins 303a. The cooling stage 30a comprises a water outlet 302a connected to a water inlet 401a of a water tank 40a through a duct 402a. The water tank 40a comprises a water outlet connected to the water inlet 202a of the water pump 20a, thus forming the liquid-cooling heat dissipation system 100a. During operation, the water pump 20a conveys cool water to the heat dissipation stage 10a for heat exchanging into hot water. Afterward, hot water flows to the cooling stage 30a through the duct 104a for heat exchanging into cool water there and cool water flows back to the water tank 40a through the duct 304a. The above operations are repeated for cyclic heat exchange.

However, above-described prior art liquid-cooling heat dissipation system 100a is composed of separate heat dissipation stage 10a, water pump 20a, cooling stage 30a and water tank 40a and ducts 103a, 104a, 304a and 402a interconnecting between above devices. The liquid-cooling heat dissipation system 100a thus formed is bulky and hard to assemble. This is adverse to the compact trend of computer.

SUMMARY OF THE INVENTION

The present invention provides a liquid-cooling heat dissipation apparatus with such mechanical design that the liquid driving unit and the cooling plate module can be advantageously integrated into the casing while the duct is reduced to achieve compact space.

Moreover, the present invention provides a liquid-cooling heat dissipation apparatus with overall structure achieves liquid storing, circulating and heat conveying function.

According to one aspect of the present invention, the liquid-cooling heat dissipation apparatus comprises a casing comprising a first compartment, a liquid driving unit placed in the first compartment, a cooling plate module on bottom of the casing, a second compartment defined between an inner space of the casing and the cooling plate module and containing a cooling liquid, at least one liquid inlet and liquid outlet being defined on the casing and communicated through the second compartment. Therefore, the cooling liquid is circulated when the liquid driving unit operates.

According to another aspect of the present invention, the at least one liquid inlet and liquid outlet are communicated through a plurality of ducts and further communicated with a liquid cooling array through another end of the duct. The liquid cooling array comprises a box, wherein a liquid inlet and a liquid outlet are arranged on both sides of the box, respectively. A plurality of heat-dissipating fins are stacked in the center of the box and arranged in a plurality of rows, wherein runner is defined between two rows of heat-dissipating fins and communicates with the liquid inlet and the liquid outlet. When the hot water in the liquid inlet flows into the liquid outlet through the runner, the hot water is heat exchanged with the heat-dissipating fins into cool water and then the cool water flows to the liquid outlet.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 2:
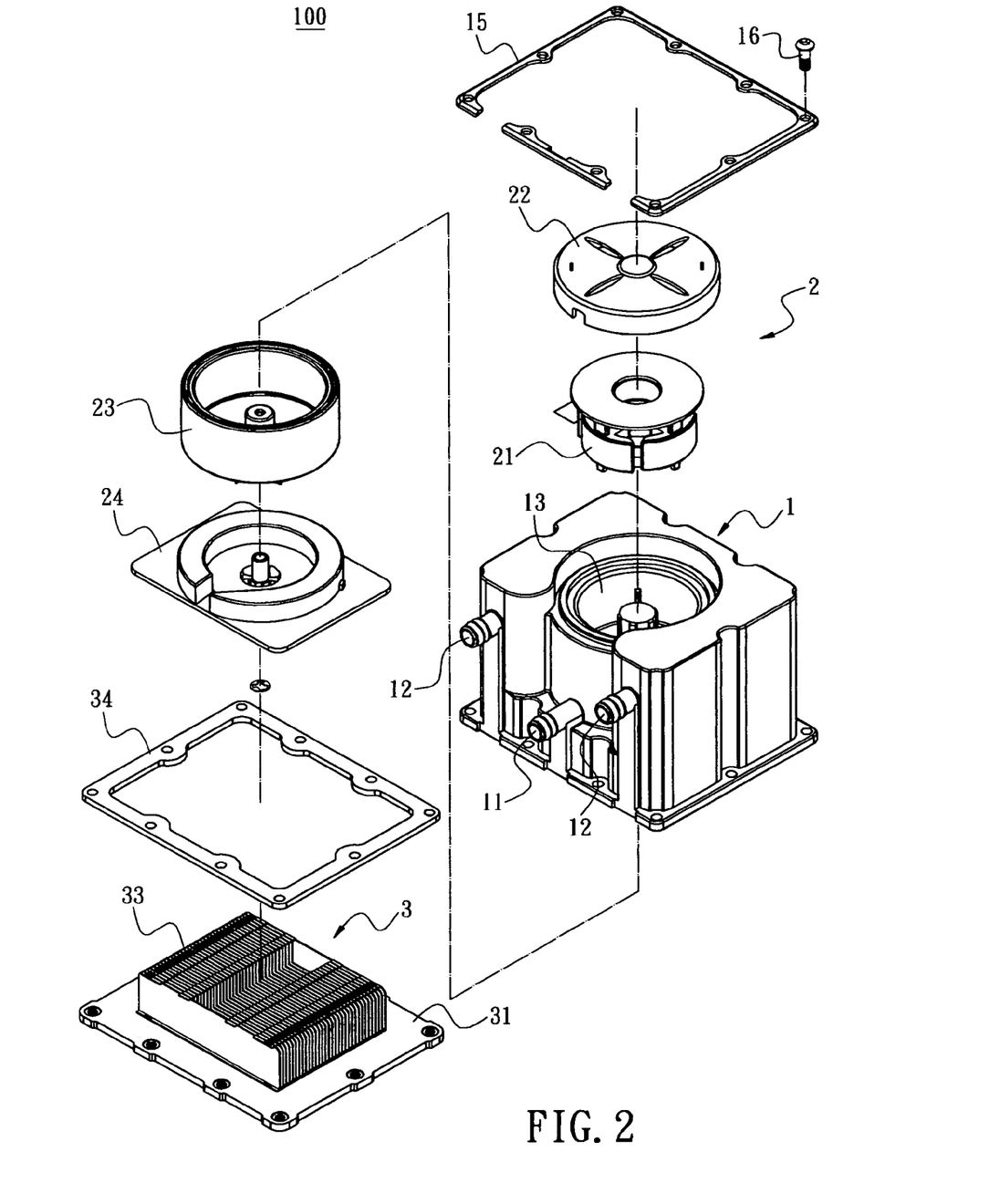
FIG. 2 shows an exploded view of the liquid-cooling heat dissipation apparatus according to the present invention.
Figure 3:
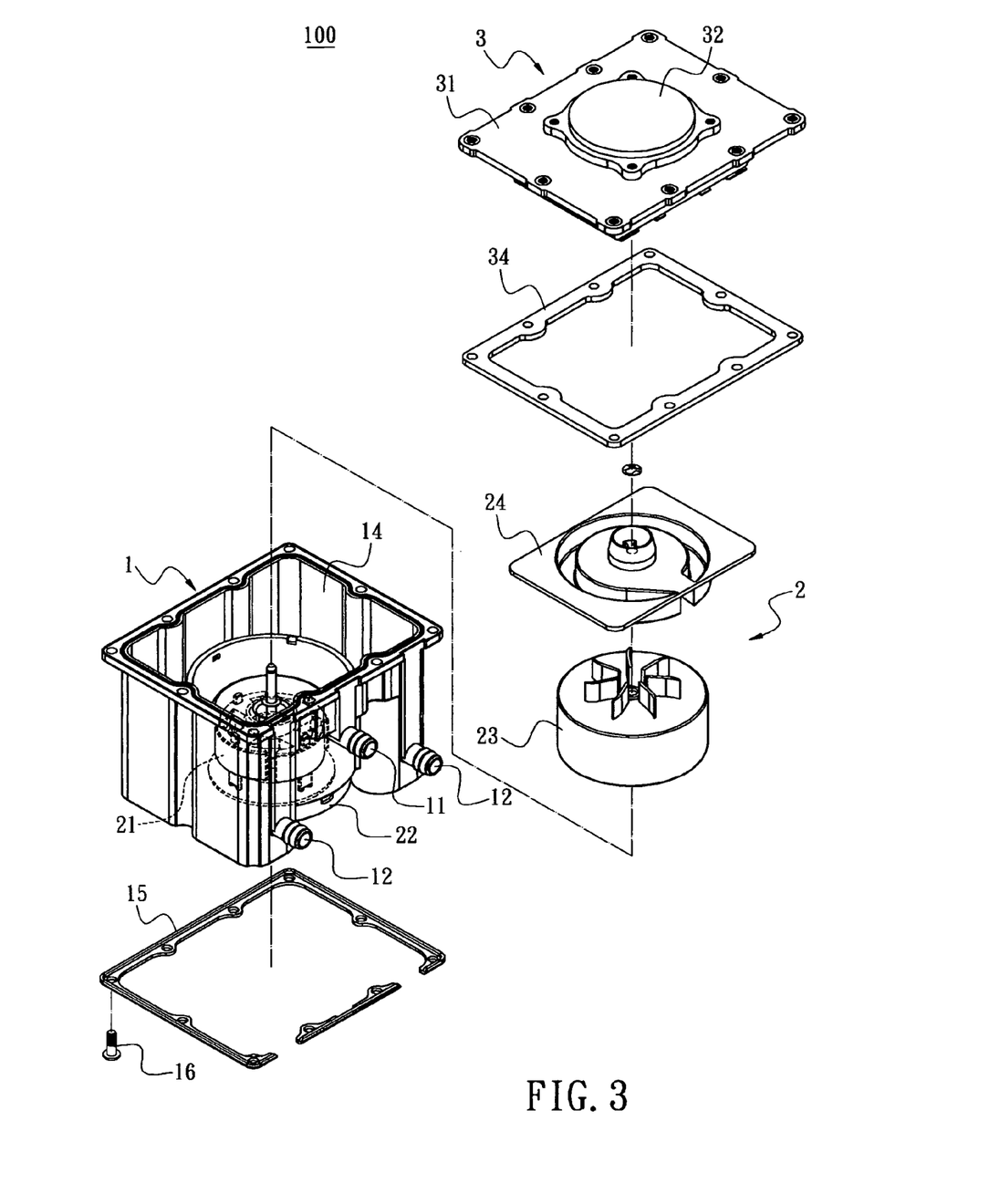
FIG. 3 shows another exploded view of the liquid-cooling heat dissipation apparatus according to the present invention.

The present invention is intended to provide a liquid-cooling heat dissipation apparatus. FIGS. 2 and 3 show a preferred embodiment of the present invention, wherein the liquid-cooling heat dissipation apparatus 100 is used for heat dissipating a heat emitting device 200 (such as CPU 200). The heat dissipation apparatus 100 comprises a casing 1, a first compartment 13 defined in the casing 1 and used for mounting a liquid driving unit 2, a cooling plate module 3 arranged on bottom of the casing 1, a second compartment 14 defined between inner space of the casing 1 and filled with cooling liquid, at least one liquid inlet 11 and liquid outlet 12 defined on the casing 1 for communicating the second compartment 14. The cooling liquid is circulated when the liquid driving unit 2 operates.

Figure 7:
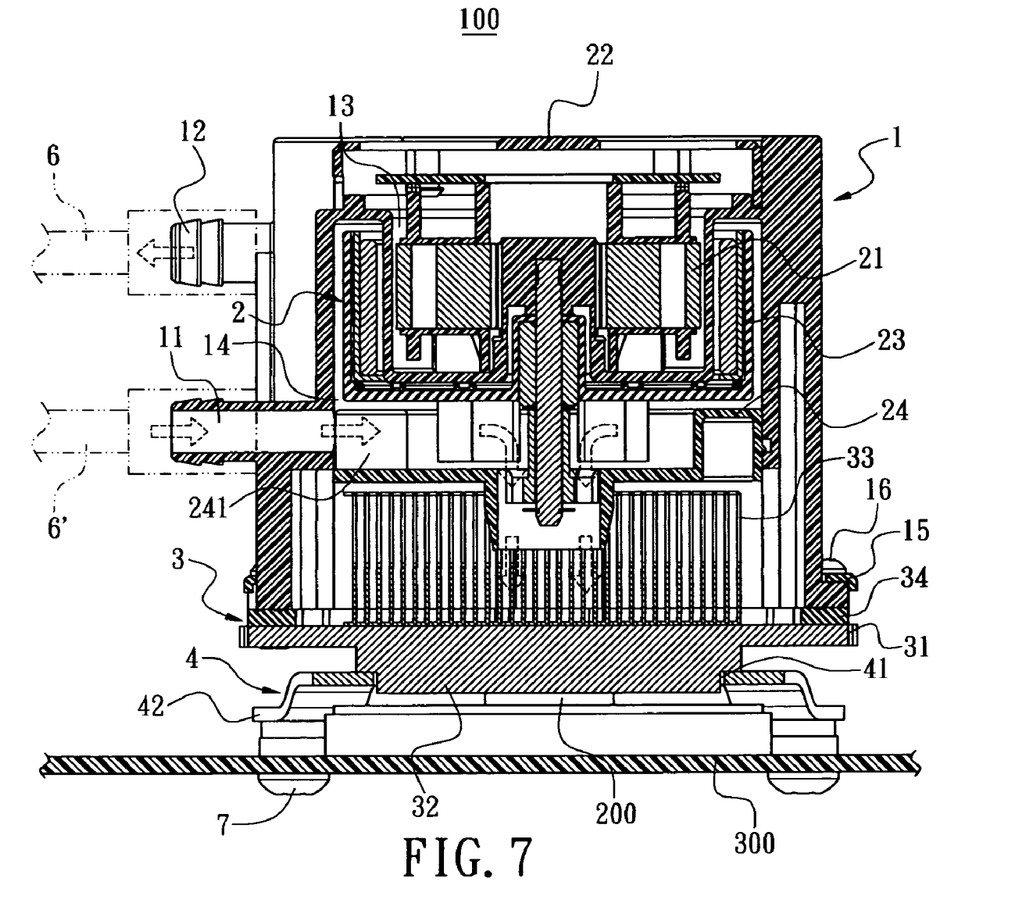
FIG. 7 shows a sectional view of the liquid-cooling heat dissipation apparatus.

In the present invention, the liquid driving unit 2 comprises a coil stage 21, an upper cover 22, an impeller stage 23, and a lower cover 24 in the first compartment 13. Moreover, at least one runner 241 is defined on bottom face of the lower cover 24 and corresponding to the liquid inlet 11 of the casing 1, as shown in FIG. 7.

The cooling plate module 3 comprises a bottom plate 31 fixed to bottom of the casing 1, a heat-dissipating plate 32 arranged on center of the bottom plate 31 and attached to the CPU 200, a plurality of heat-dissipating fins 33 provided atop the bottom plate 31. Sealing pads 15, 34 are provided between the bottom of the casing 1 and the bottom plate 31. Bolt members 16 fix the bottom plate 31 to the bottom of the casing 1; and the sealing pads 15, 34 place between the casing 1 and the bottom plate 31 hermitically to prevent leakage of the cooling liquid.

Figure 4:
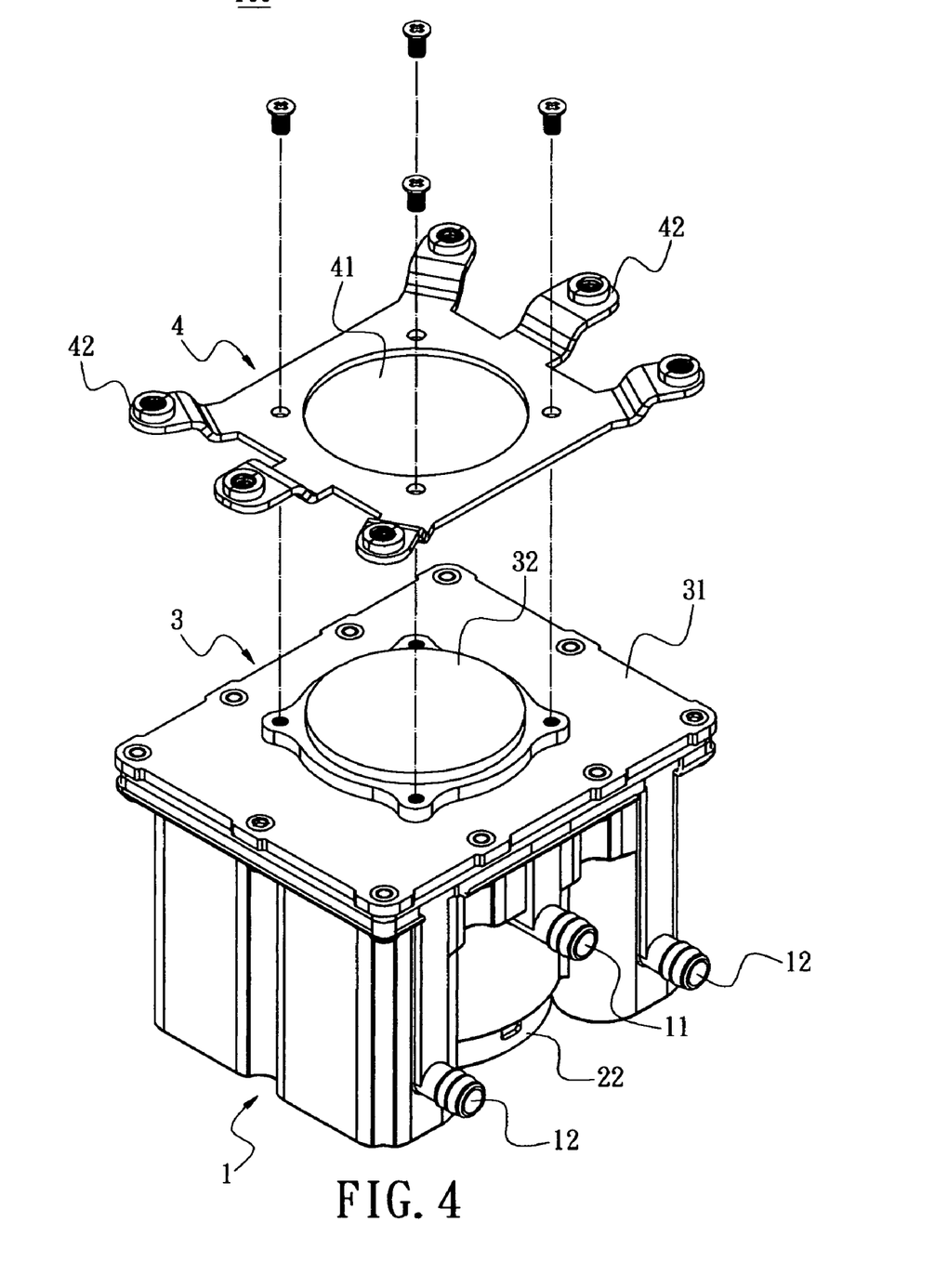
FIG. 4 shows a perspective view of the liquid-cooling heat dissipation apparatus to be assembled with a frame.
Figure 5:
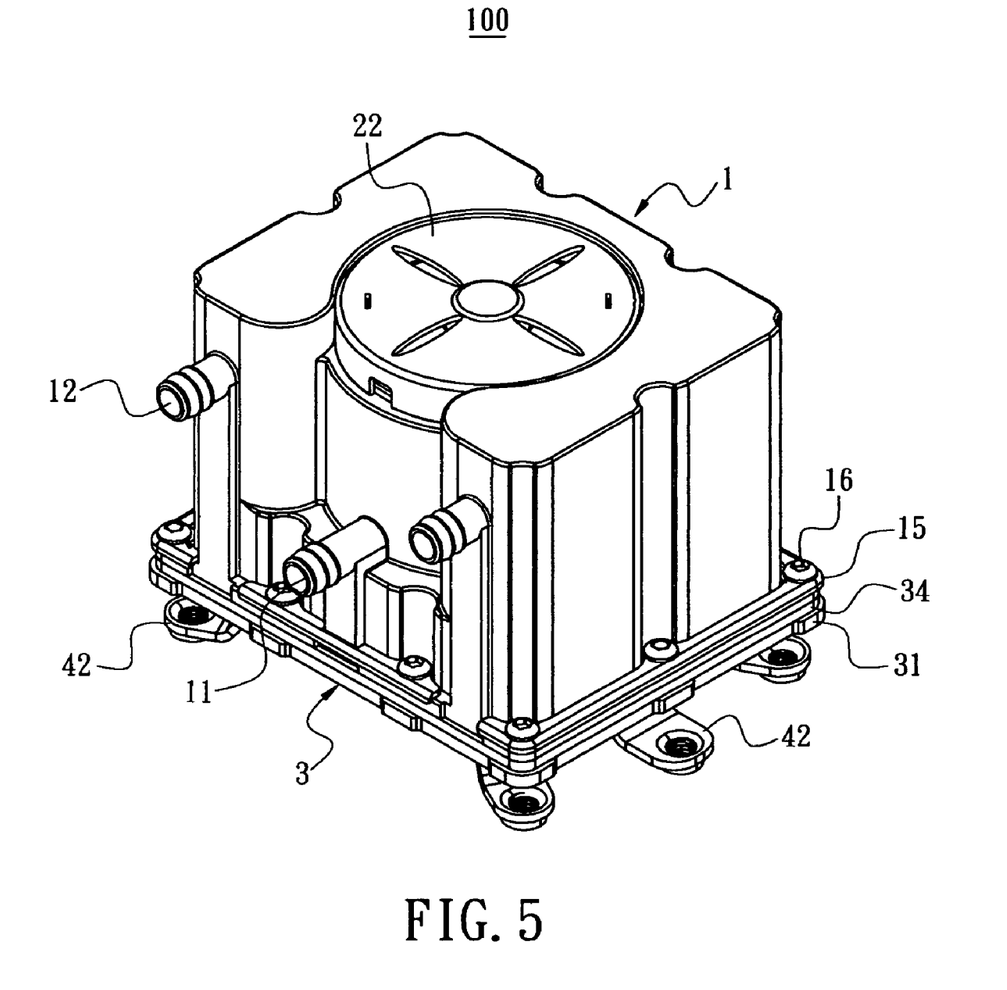
FIG. 5 shows a perspective view of the liquid-cooling heat dissipation apparatus already assembled with the frame.

With reference to FIGS. 4 and 5, a frame 4 is screwed to bottom of the cooling plate module 3 and having an opening 41 defined at center thereof such that the heat-dissipating plate 32 exposes out from the opening 41 and is in contact with the CPU 200. Locking tabs 42 extend outward from two opposite sides of the frame 4 and function as fixing unit to mount on the motherboard 300.

Figure 6:
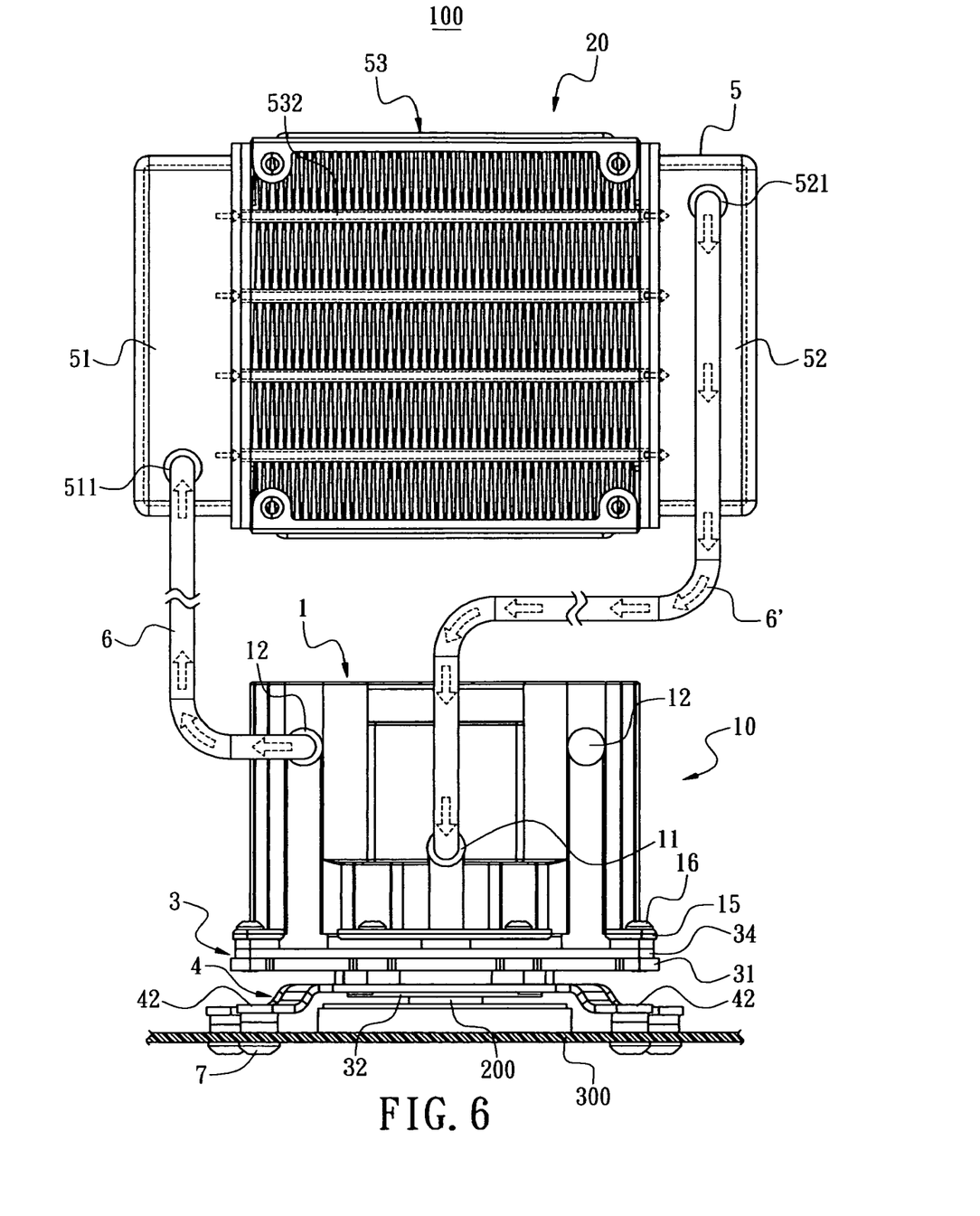
FIG. 6 shows a perspective view of the liquid-cooling heat dissipation apparatus.

With reference now to FIG. 6, a liquid cooling array 20 comprises a box 5, wherein a liquid inlet 51 and a liquid outlet 52 are arranged on both sides of the box 5, respectively. A plurality of heat-dissipating fins 53 are stacked in the center of the box 5 and arranged in a plurality of rows, wherein runner 532 is defined between two rows of heat-dissipating fins 53 and communicates with the liquid inlet 51 and the liquid outlet 52. When the hot water in the liquid inlet 51 flows into the liquid outlet 52 through the runner 532, the hot water is heat exchanged with the heat-dissipating fins 53 into cool water and then the cool water flows to the liquid outlet 52.

In the shown embodiment, there are two liquid outlets 12 on the casing 1. In case of only one liquid cooling array 20, one outlet 12 is connected to the entrance 511 of the liquid inlet 51 through a duct 6; the exit 521 of the liquid outlet 52 of the liquid cooling array 20 is connected to the liquid inlet 11 of the casing 1 through a duct 6'. When two set of liquid cooling arrays 20 are to be used, two liquid outlets 12 on the casing 1 are connected to the two liquid cooling arrays 20 through the ducts 6.

To assemble the liquid-cooling heat dissipation apparatus according to the present invention, the liquid-cooling heat dissipation apparatus 100 is first arranged atop the CPU 200 and the locking tabs 42 of the frame 4 is locked to the motherboard 300 by the bolt unit 7. Therefore, the casing 1 is assembled atop the CPU 200 and liquid is circulated between the casing 1 and the liquid cooling array 20 through the ducts 6 and 6'.

In the present invention, a vent hole (not shown) is additionally defined on the casing 1 and sealed by a cover (not shown). The cover is removed when liquid is to be filled into the casing 1. Therefore, the casing 1 is no longer a closed space and liquid is filled into the second compartment 14 through the liquid inlet 11 of the casing 1.

Figure 8:
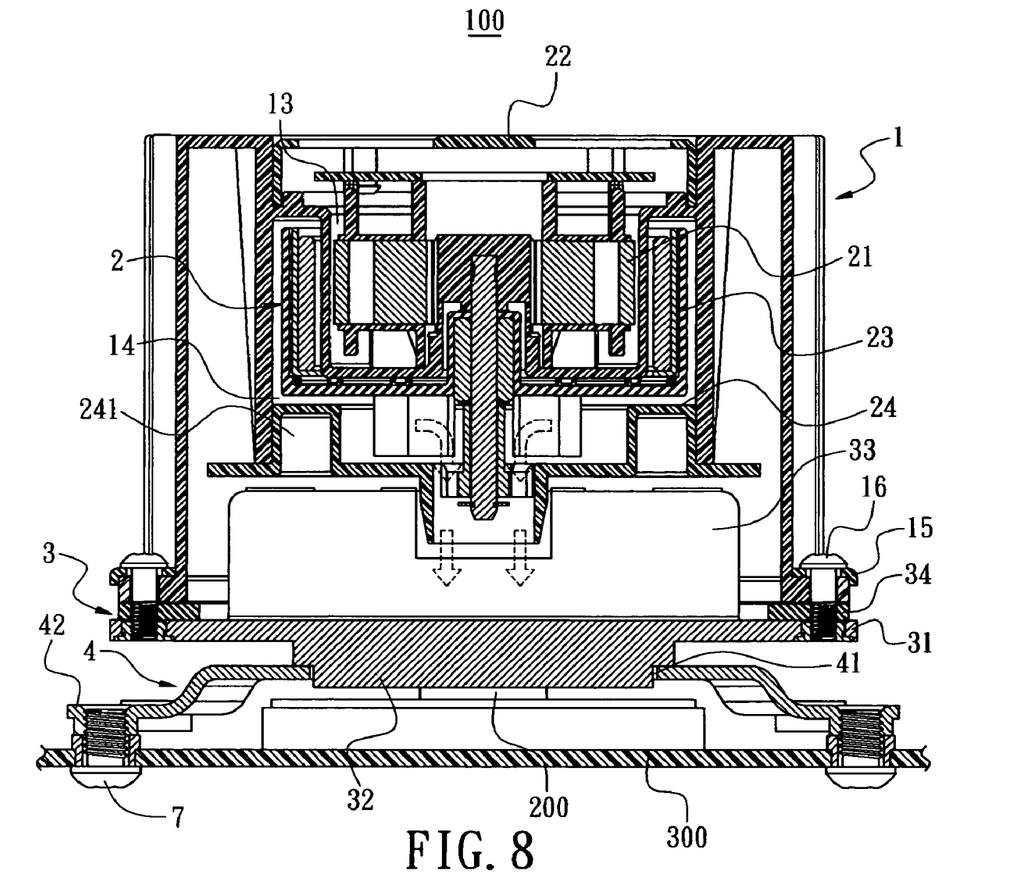
FIG. 8 shows another sectional view of the liquid-cooling heat dissipation apparatus.

With reference to FIGS. 7 and 8, during operation of the liquid-cooling heat dissipation apparatus according to the present invention, cooling liquid in the liquid cooling array 20 is driven, by the liquid driving unit 2, into the runner 241 of the lower cover 24 through the liquid inlet 11 of the casing 1. Thereafter, cooling liquid is conveyed downward from the exit of the runner 241 of the lower cover 24 to the plurality of heat-dissipating fins 33 for heat exchanging into hot water. Therefore, the cooling plate module 3 has fast heat dissipation and the heat dissipation for the CPU 200 can be enhanced. Afterward, hot liquid flows to the liquid inlet 51 of the liquid cooling array 20 from the liquid outlet 12 of the casing 1 and through the duct 6.

The hot liquid such as hot water conveyed to the liquid inlet 51 of the liquid cooling array 20 then flows to the runner 532 and undergoes heat exchange into cool water by the heat-dissipating fins 53 beside the runner 532. The cool water is conveyed to the liquid outlet 52 of the liquid cooling array 20. Thereafter, the cool water is sent to the second compartment 14 of the casing 1 through the duct 6' for next cycle of heat exchange.

The liquid driving unit 2 and the cooling plate module 3 can be advantageously integrated into the casing 1 according to the present invention, while the duct is reduced to achieve compact space. Moreover, the overall structure achieves liquid storing, circulating and heat conveying function.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A liquid-cooling heat dissipation apparatus used to convey heat from a heat source, comprising:
   a casing comprising a first compartment defined therein for a liquid driving unit to be mounted inside, a cooling plate module arranged on bottom of the casing, a second compartment defined between an inner space of the casing and the cooling plate module and containing a cooling liquid, at least one liquid inlet and liquid outlet being defined on the casing, and
   wherein the liquid driving unit comprises a coil stage, an upper cover, an impeller stage and a lower cover, at least one runner being defined on the lower cover and corresponding to the liquid inlet, and
   wherein the cooling plate module comprises a bottom plate fixed to bottom of the casing and a plurality of heat-dissipating fins provided atop the bottom plate,
   whereby the cooling liquid is circulated when the liquid driving unit operates.

2. The liquid-cooling heat dissipation apparatus as in claim 1, wherein fixing units are provided on peripheral of the cooling plate module and assemble the cooling plate module with a heat emitting device, wherein a bottom of the cooling plate module is in close contact with the heat emitting device.

3. The liquid-cooling heat dissipation apparatus as in claim 1, wherein a frame is assembled to a bottom of the cooling plate module, and the frame keeps the bottom of the cooling plate module in close contact with the heat emitting device.

4. The liquid-cooling heat dissipation apparatus as in claim 1, wherein the at least one liquid inlet and liquid outlet are communicated through a plurality of ducts with a liquid cooling array.

5. The liquid-cooling heat dissipation apparatus as in claim 1, further comprising at least one sealing pad placed between the casing and the cooling plate module.

6. A liquid-cooling heat dissipation apparatus used to convey heat from a heat source, comprising:
   a casing comprising a first compartment, a liquid driving unit, a cooling plate module on bottom of the casing, a second compartment defined between an inner space of the casing and the cooling plate module and containing a cooling liquid, at least one liquid inlet and liquid outlet being defined on the casing and communicated through the second compartment, whereby the cooling liquid is circulated when the liquid driving unit operates, and wherein a frame is assembled to a bottom of the cooling plate module, and the frame keeps the bottom of the cooling plate module in close contact with the heat emitting device.

7. The liquid-cooling heat dissipation apparatus as in claim 6, wherein fixing units are provided on peripheral of the frame and assemble the cooling plate module with a heat emitting device.

8. The liquid-cooling heat dissipation apparatus as in claim 6, wherein the at least one liquid inlet and liquid outlet are communicated through a plurality of ducts with a liquid cooling array.

9. The liquid-cooling heat dissipation apparatus as in claim 6, further comprising at least one sealing pad placed between the casing and the cooling plate module.

10. The liquid-cooling heat dissipation apparatus as in claim 6, wherein the cooling plate module comprises a plurality of heat-dissipating fins on top face thereof.

* * * * *